United States Patent
Fujiwara et al.

(10) Patent No.: US 9,281,826 B2
(45) Date of Patent: Mar. 8, 2016

(54) CIRCUIT, VOLTAGE CONTROL OSCILLATOR, AND OSCILLATION FREQUENCY CONTROL SYSTEM

(71) Applicant: Sony Corporation, Tokyo (JP)

(72) Inventors: Tetsuya Fujiwara, Kanagawa (JP); Yusuke Tanaka, Tokyo (JP); Norihito Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/626,109

(22) Filed: Feb. 19, 2015

(65) Prior Publication Data
US 2015/0256185 A1 Sep. 10, 2015

(30) Foreign Application Priority Data
Mar. 7, 2014 (JP) .................. 2014-045194

(51) Int. Cl.
H03B 5/12 (2006.01)
H03L 7/06 (2006.01)

(52) U.S. Cl.
CPC ............... H03L 7/06 (2013.01); H03B 5/1265 (2013.01); H03B 2200/005 (2013.01); H03B 2201/011 (2013.01)

(58) Field of Classification Search
CPC ........... H03B 5/1265; H03B 2200/005; H03B 2201/011; H03B 2201/0208
USPC ....................... 331/36 C, 117 FE, 117 R, 167
See application file for complete search history.

(56) References Cited

U.S. PATENT DOCUMENTS

| 7,002,393 | B2 * | 2/2006 | Yeh | H03B 5/04 327/157 |
| 7,230,504 | B1 * | 6/2007 | Marques | H03B 5/1228 331/117 FE |
| 7,253,693 | B2 * | 8/2007 | Zhang | H03L 7/099 331/105 |
| 7,764,127 | B2 * | 7/2010 | Sun | H03L 7/099 331/117 FE |
| 8,044,741 | B2 * | 10/2011 | Barton | H03L 7/0991 331/117 FE |
| 8,400,226 | B2 * | 3/2013 | Chen | H03B 5/1228 331/117 FE |
| 8,841,975 | B2 * | 9/2014 | Nakamura | H03L 7/02 331/108 A |
| 2006/0192598 | A1 * | 8/2006 | Baird | H03L 7/099 327/100 |
| 2007/0247237 | A1 * | 10/2007 | Mohammadi | H03B 5/1228 331/36 C |
| 2009/0033434 | A1 * | 2/2009 | Ikeda | H03B 5/36 331/36 C |

(Continued)

FOREIGN PATENT DOCUMENTS

JP  2003-158192  5/2003
JP  2013-089997  5/2013

*Primary Examiner* — Levi Gannon
(74) *Attorney, Agent, or Firm* — Michael Best & Friedrich LLP (57) ABSTRACT

A circuit includes first and second capacitances arranged on a first path that connects first and second terminals; a first switch arranged between the first capacitance and the second capacitance; a second switch arranged on a second path that connects a reference voltage section and a first node formed between the first capacitance and the first switch; a third switch arranged on a third path that connects the section and a second node formed between the second capacitance and the first switch; a first resistance arranged on a fourth path that connects the first node and a third node formed between the first terminal and the first capacitance; a second resistance arranged on a fifth path that connects the second node and a fourth node formed between the second terminal and the second capacitance; a fourth switch on the fourth path; and a fifth switch on the fifth path.

4 Claims, 6 Drawing Sheets

(56) References Cited

U.S. PATENT DOCUMENTS

2010/0007427 A1* 1/2010 Tomita .................. H03H 19/004
 331/117 FE

2014/0320215 A1* 10/2014 Staszewski ........ H03H 11/0405
 331/18

* cited by examiner

CIRCUIT, VOLTAGE CONTROL OSCILLATOR, AND OSCILLATION FREQUENCY CONTROL SYSTEM

CROSS REFERENCE TO RELATED APPLICATIONS

This application claims the benefit of Japanese Priority Patent Application JP 2014-045194 filed Mar. 7, 2014, the entire contents of which are incorporated herein by reference.

BACKGROUND

The present disclosure relates to a circuit, a voltage control oscillator, and an oscillation frequency control system.

In the past, a wireless communication device such as a mobile phone and a television broadcasting receiver includes a phase locked loop (PLL) and a mixer circuit to frequency-convert a high-frequency signal into an intermediate frequency signal. The mixer circuit uses a local oscillation signal generated by the PLL to convert a high-frequency signal into an intermediate frequency signal and outputs the converted signal.

Figure 14:
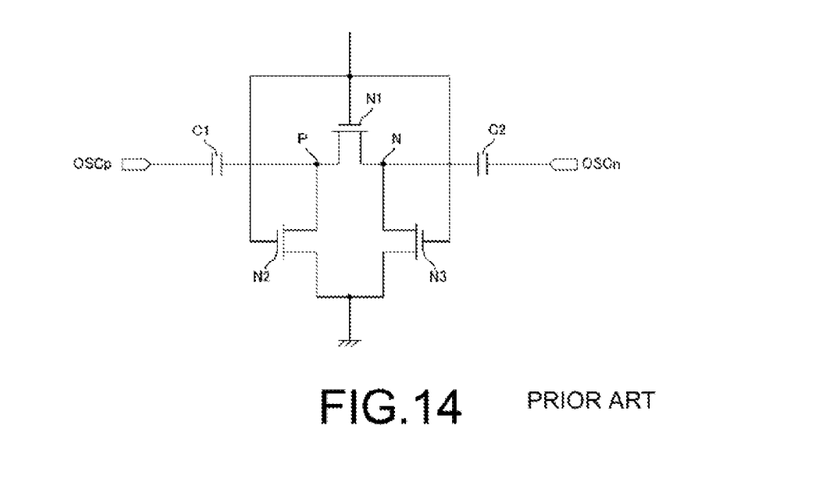
FIG. 14 is a diagram showing the configuration of a unit capacitance in the past.

The PLL includes a voltage control oscillator (VCO) that generates a local oscillation signal depending on control voltage. As shown in FIG. 14, as the VCO, a unit capacitance including an inductor L and a capacitor C is normally used (see, for example, Japanese Patent Application Laid-open No. 2013-089997).

SUMMARY

In the unit capacitance that is disclosed in Japanese Patent Application Laid-open No. 2013-089997 and shown in FIG. 14, a differential capacitive circuit is arranged between oscillation terminals OSCp and OSCn. The differential capacitive circuit includes a capacitive element C1 whose one end is connected to the oscillation terminal OSCp, a capacitive element C2 whose one end is connected to the oscillation terminal OSCn, and a switch circuit arranged between the capacitive element C1 and the capacitive element C2.

The switch circuit includes an NMOS transistor N1 that forms a source-drain path between a node P and a node N, an NMOS transistor N2 that forms a source-drain path between the node P and ground, and an NMOS transistor N3 that forms a source-drain path between the node N and the ground.

However, it has been known that in the LC-VCO configured as described above, the oscillation waveform is clipped to degrade the phase noise performance.

Moreover, the node P and the node N are high-impedance nodes connected to each other by off-leakage current of the NMOS transistor N1 when the differential capacitive circuit is turned off (switch circuit is turned off). However, if the NMOS transistor N1 is formed in a miniaturization process, for example, off-leakage current and gate-leakage current are in balance with each other, which affects the simulation time or simulation accuracy at the design stage.

The present disclosure has been made in view of the above circumstances, and it is desirable to realize at least one of improvement of the phase noise performance in the LC-VCO and improvement of the simulation time or simulation accuracy at the design stage.

According to an embodiment of the present disclosure, there is provided a circuit including a first capacitance arranged on a first path that connects a first terminal and a second terminal, a second capacitance arranged on the first path between the first capacitance and the second terminal, a first switch arranged on the first path between the first capacitance and the second capacitance, a second switch arranged on a second path that connects a first node and a reference voltage section, the first node being formed on the first path between the first capacitance and the first switch, a third switch arranged on a third path that connects a second node and the reference voltage section, the second node being formed on the first path between the second capacitance and the first switch, a first resistance arranged on a fourth path that connects a third node and the first node, the third node being formed on the first path between the first terminal and the first capacitance, a second resistance arranged on a fifth path that connects a fourth node and the second node, the fourth node being formed on the first path between the second terminal and the second capacitance, a fourth switch arranged on the fourth path, and a fifth switch arranged on the fifth path.

According to an embodiment of the present disclosure, there is provided a voltage control oscillator including an LC resonance circuit that is configured to oscillate at a resonance frequency depending on control voltage and includes a capacitive circuit, the capacitive circuit including a first capacitance arranged on a first path that connects a first terminal and a second terminal, a second capacitance arranged on the first path between the first capacitance and the second terminal, a first switch arranged on the first path between the first capacitance and the second capacitance, a second switch arranged on a second path that connects a first node and a reference voltage section, the first node being formed on the first path between the first capacitance and the first switch, a third switch arranged on a third path that connects a second node and the reference voltage section, the second node being formed on the first path between the second capacitance and the first switch, a first resistance arranged on a fourth path that connects a third node and the first node, the third node being formed on the first path between the first terminal and the first capacitance, a second resistance arranged on a fifth path that connects a fourth node and the second node, the fourth node being formed on the first path between the second terminal and the second capacitance, a fourth switch arranged on the fourth path, and a fifth switch arranged on the fifth path.

According to an embodiment of the present disclosure, there is provided an oscillation frequency control system including a communication apparatus including a voltage control oscillator that includes an LC resonance circuit configured to oscillate at a resonance frequency, and a control circuit configured to control the resonance frequency of the voltage control oscillator; and a control apparatus configured to instruct the control circuit on a resonance frequency, the LC resonance circuit including a capacitive bank circuit in which a plurality of capacitive circuits and a plurality of switch circuits are connected in series and arranged between the first terminal and the second terminal in parallel, each of the plurality of capacitive circuits including a first capacitance arranged on a first path that connects a first terminal and a second terminal, a second capacitance arranged on the first path between the first capacitance and the second terminal, a first switch arranged on the first path between the first capacitance and the second capacitance, a second switch arranged on a second path that connects a first node and a reference voltage section, the first node being formed on the first path between the first capacitance and the first switch, a third switch arranged on a third path that connects a second node and the reference voltage section, the second node being formed on the first path between the second capacitance and the first switch, a first resistance arranged on a fourth path that connects a third node and the first node, the third node being formed on the first path between the first terminal and the first capacitance, a second resistance arranged on a fifth path that connects a fourth node and the second node, the fourth node being formed on the first path between the second terminal and the second capacitance, a fourth switch arranged on the fourth path, and a fifth switch arranged on the fifth path, the control circuit being configured to switch the switch circuit depending on the resonance frequency instructed by the control apparatus.

It should be noted that the circuit, the voltage control oscillator, and the oscillation frequency control system described above include various embodiments, e.g., they are implemented in the state of being incorporated into another apparatus or implemented with another method. Moreover, the embodiments of the present disclosure can be achieved as a control method including the steps corresponding to the configuration of the oscillation frequency control system, a program that causes a computer to realize the function corresponding to the configuration of the oscillation frequency control system, a computer-readable recording medium that stores the program, and the like.

According to the present disclosure, it is possible to realize at least one of improvement of the phase noise performance in the LC-VCO and improvement of the simulation time or simulation accuracy at the design stage. It should be noted that the effect described herein is not necessarily restrictive, and additional effects may be provided.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 2 is an explanatory diagram for simply describing a differential capacitive circuit at the time of capacitance-on;

DETAILED DESCRIPTION OF EMBODIMENTS

Hereinafter, embodiments of the present disclosure will be described with reference to the drawings in the following order.

Figure 1:
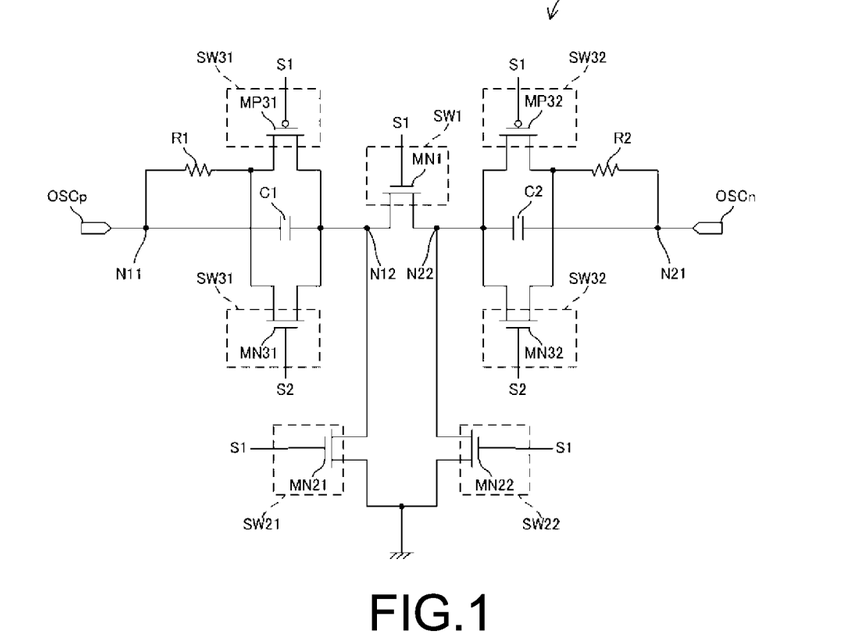
FIG. 1 is a diagram showing an example of the configuration of a circuit according to a first embodiment of the present disclosure.

(1) First embodiment
(2) Second embodiment
(3) Third embodiment (1) First Embodiment FIG. 1 is a diagram showing an example of the configuration of a circuit according to a first embodiment of the present disclosure;
(Capacitance)

A circuit 100 shown in FIG. 1 is so-called a differential capacitive circuit in which a terminal OSCp serving as a first terminal and a terminal OSCn serving as a second terminal are connected to each other via capacitances C1 and C2 connected in series. The path that connects the terminal OSCp and the terminal OSCn in which the capacitances C1 and C2 are arranged constitutes a first path in this embodiment. To the terminal OSCp and the terminal OSCn, complementary periodic signals whose phases are inverted are input.

The capacitance C1 and the capacitance C2 are connected to each other via a switch circuit SW1 serving as a first switch. In FIG. 1, the capacitance C1 is arranged on the side of the terminal OSCp, and the capacitance C2 is arranged on the side of the terminal OSCn.

It should be noted that in the following, a node between the capacitance C1 and the terminal OSCp is referred to as a node N11, a node between the capacitance C2 and the terminal OSCn is referred to as a node N21, a node between the capacitance C1 and the switch circuit SW1 is referred to as a node N12, and a node between the capacitance C2 and the switch circuit SW1 is referred to as a node N22. In this embodiment, the node N11 constitutes a third node, the node N21 constitutes a fourth node, the node N12 constitutes a first node, and the node N22 constitutes a second node.
(Switch Circuit SW1)

The switch circuit SW1 includes a negative channel metal oxide semiconductor (NMOS) transistor MN1, for example, and forms a drain-source path between the node N12 and the node N22. It should be noted that the switch circuit SW1 may include a positive channel metal oxide semiconductor (PMOS) transistor or a complementary metal oxide semiconductor (CMOS) transistor.

The switch circuit SW1 is controlled to be turned on and off by a control signal S1.

When the switch circuit SW1 is controlled to be turned on, the capacitances C1 and C2 are connected in series between the terminal OSCp and the terminal OSCn. Thus, a differential capacitive circuit is formed between the terminal OSCp and the terminal OSCn. On the other hand, when the switch circuit SW1 is controlled to be turned off, the capacitances C1 and C2 are disconnected. Therefore, a differential capacitive circuit is not formed between the terminal OSCp and the terminal OSCn.
(Switch Circuit SW2)

The node N12 is connected to the ground via a switch circuit SW21 serving as a second switch, and the node N22 is connected to the ground via a switch circuit SW22 serving as a third switch. It should be noted that in this embodiment, the ground constitutes a reference voltage section, a path that connects the node N12 and the ground constitutes a second path, and a path that connects the node N22 and the ground constitutes a third path.

The switch circuit SW21 includes an NMOS transistor MN21, for example, and forms a drain-source path between the node N12 and the ground. It should be noted that the switch circuit SW21 may include a PMOS transistor or a CMOS transistor.

The switch circuit SW22 includes an NMOS transistor MN22, for example, and forms a drain-source path between the node N22 and the ground. It should be noted that the switch circuit SW22 may include a PMOS transistor or a CMOS transistor.

The switch circuits SW21 and SW22 are controlled to be turned on and off in synchronization with the switch circuit SW1. For example, in the case where the switch circuits SW1, SW21, and SW22 each include a MOS transistor, a MOS transistor having the same conductive type as the switch circuit SW1 is controlled to be turned on and off by the control signal S1, and a MOS transistor having a conductive type different from the switch circuit SW1 is controlled to be turned on and off by a control signal S2 obtained by inverting the control signal S1.

(Shunt Circuit)

The node N11 and the node N12 are connected not only through a path over the capacitance C1 but also through a path over a switch circuit SW31 serving as a fourth switch and a resistance R1 serving as a first resistance, which are connected in series. This path constitutes a fourth path in this embodiment. Similarly, the node N21 and the node N22 are connected not only through a path over the capacitance C2 but also through a path over a switch circuit SW32 serving as a fifth switch and a second resistance R2 serving as a second resistance, which are connected in series. This path constitutes a fifth path in this embodiment.

It should be noted that the order of arranging the switch circuit SW31 and the resistance R1 between the node N11 and the node N12 and the order of arranging the switch circuit SW32 and the resistance R2 between the node N21 and the node N22 can be exchanged as appropriate.

The switch circuit SW31 includes a CMOS transistor of an NMOS transistor MN31 and a PMOS transistor MP31, for example, and forms a drain-source path between the node N11 and the node N12. It should be noted that the switch circuit SW31 may include an NMOS transistor or a PMOS transistor.

The switch circuit SW32 includes a CMOS transistor of an NMOS transistor MN32 and a PMOS transistor MP32, for example, and forms a drain-source path between the node N21 and the node N22. It should be noted that the switch circuit SW31 may include an NMOS transistor or a PMOS transistor.

The switch circuits SW31 and SW32 are controlled to be turned on and off in synchronization with each other, and to be turned on and off reversely with the switch circuit SW1.

For example, in the case where the switch circuits SW1, SW31, and SW32 each include a MOS transistor, a MOS transistor having the same conductive type as the switch circuit SW1 is controlled to be turned on and off by the control signal S2 obtained by inverting the control signal S1, and a MOS transistor having a conductive type different from the switch circuit SW1 is controlled to be turned on and off by the control signal S1.

(Operation at Time of Capacitance-on)

Figure 2:
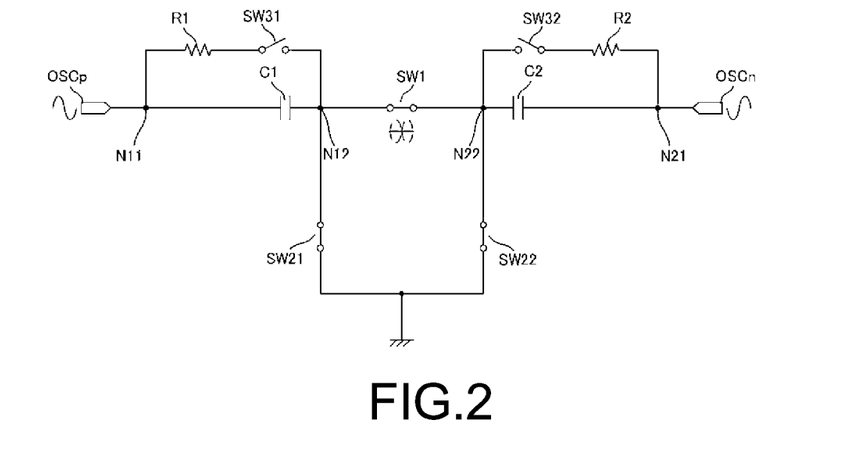

FIG. 2 is an explanatory diagram for simply describing a differential capacitive circuit at the time of capacitance-on.

When the switch circuits SW31 and SW32 are controlled to be turned off, the node N11 and the node N12 are connected to each other via the capacitance C1, and the node N21 and the node N22 are connected to each other via the capacitance C2.

At this time, because the switch circuit SW1 is controlled to be turned on, the terminal OSCp and the terminal OSCn are electrically connected to each other via the capacitances C1 and C2 connected in series. Therefore, the voltage of the nodes N12 and N22 is DC voltage because the periodic signal input from the terminal OSCp and the periodic signal input from the terminal OSCn are canceled out with each other. This state will be referred to as "capacitance-on."

Because the switch circuits SW21 and SW22 are controlled to be turned on at the time of capacitance-on, the nodes N12 and N22 are connected to the ground.

At this time, also the switch circuit SW1, which is turned on and off in synchronization with the switch circuits SW21 and SW22, is controlled to be turned on. Therefore, drain-source voltage of the switch circuit SW1 is in a stronger "on" state because the nodes N12 and N22 are connected to the ground.

Moreover, the path of the switch circuit SW31 has a very high resistance at the time of capacitance-on because the switch circuit SW31 is turned off. Therefore, the DC bias point of the voltage of the node N12 is determined at the on-resistance of the switch circuit SW21.

Similarly, the path of the switch circuit SW32 has a very high resistance because the switch circuit SW32 is turned off. Therefore, the DC bias point of the voltage of the node N22 is determined at the on-resistance of the switch circuit SW22.

(Operation at Time of Capacitance-Off)

Figure 3:
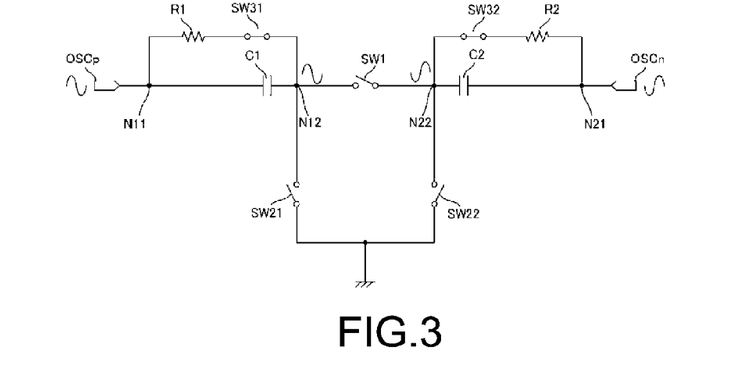
FIG. 3 is an explanatory diagram for simply describing the differential capacitive circuit at the time of capacitance-off.

FIG. 3 is an explanatory diagram for simply describing a differential capacitive circuit at the time of capacitance-off.

When the switch circuits SW31 and SW32 are controlled to be turned on, the node N11 and the node N12 are connected via the resistance R1 (and the on-resistance of the switch circuit SW31), and the node N21 and the node N22 are connected via the resistance R2 (and the on-resistance of the switch circuit SW32).

Specifically, the path of the capacitance C1 is shunted by the path of the resistance R1 (and the on-resistance of the switch circuit SW31), and the path of the capacitance C2 is shunted by the path of the resistance R2 (and the on-resistance of the switch circuit SW32).

At this time, because the switch circuit SW1 is controlled to be turned off, the terminal OSCp and the terminal OSCn are in a high-impedance state. Accordingly, the node N12 and the node N22 viewed from the terminal OSCp and the terminal OSCn are each a highpass filter with respect to an AC signal.

Specifically, the waveform of the node N12 is equivalent to that of the terminal OSCp, and the waveform of the node n22 is equivalent to that of the terminal OSCn. Therefore, no AC charge is exchanged between the terminal OSCp and the terminal OSCn, and no capacitance C is seen. This state will be referred to as "capacitance-off."

Because the switch circuits SW21 and SW22 are controlled to be turned off, and the switch circuits SW31 and SW32 are controlled to be turned on at the time of capacitance-off, the DC bias point of the node N12 is determined on the path of the switch circuit SW31, and the DC bias point of the node N22 is determined on the path of the switch circuit SW32.

As described above, the node N12 and the node N11 are connected through a resistance and a switch circuit, and the node N22 and the node N21 are connected through a resistance and a switch circuit. There is no need to provide a resistance having a large value, which occupies a large area at the time of capacitance-on, and thus, a resistance having a small area can be used. Moreover, because impedance can be managed by the resistances R1 and R2 at the time of capacitance-off, it is possible to easily manage a quality factor Qc.

(Description of Characteristics)

Figure 4:
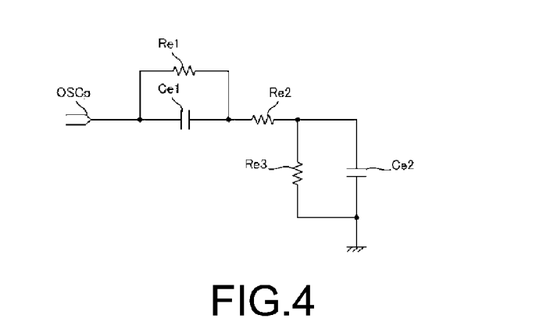
FIG. 4 is a diagram showing an equivalent half-circuit of the differential capacitive circuit according to the first embodiment.

FIG. 4 is a diagram showing an equivalent half-circuit of the circuit 100 according to this embodiment.

FIG. 4 shows the circuit 100 on the side of the terminal OSCp. In FIG. 4, Ce1 represents the capacitance C1 (C2), Re1 represents the on-resistance of the resistance R1 (R2) and the switch circuit SW31, Re2 represents a wiring resistance, Re3 represents the on/off resistance of the switch circuit SW21 (SW22) and the switch circuit SW1 (SW1), and Ce2 represents a parasitic capacitance of the node N12. It should be noted that signs in brackets represent those in the case of the circuit 100 on the side of the terminal OSCp.

As can be seen from FIG. 4, because the node N12 and the node N22 have the same voltage as oscillation common voltage at the time of capacitance-off, it is possible to avoid the phase noise degradation due to diode clipping. It should be noted that the diode clipping represents the following phenomenon.

In the case where the switch circuits SW31 and SW32 and the resistances R1 and R2 are not provided, the voltage of the node N12 and the node N22 oscillates with the same amplitude as the terminals OSCp and OSCn at the time of capacitance-off. At this time, the node N12 and the node N22 are connected to the ground via the off-resistance of the switch circuits SW21 and SW22.

Figure 5:
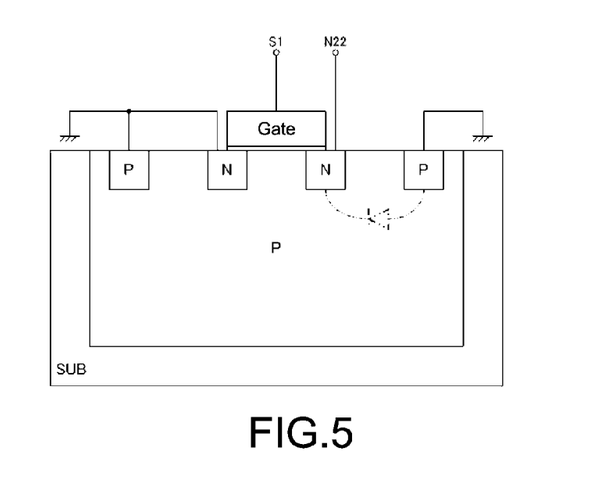
FIG. 5 is a diagram showing the vertical structure of a switch circuit (NMOS transistor)

It should be noted that if the switch circuit SW21 includes an NMOS transistor, the vertical structure thereof is as shown in FIG. 5. Specifically, one N well and one P well (bulk terminals) are connected to the ground. On the other hand, the other N well (bulk terminal) is connected to the node N22, and the other P well (bulk terminal) is connected to the ground. Therefore, reverse voltage is applied to a diode formed by the other N well and the other P well (bulk terminals).

Therefore, in the case where the voltage amplitude of the node N22 is higher than a threshold value Vth of the diode, the diode breaks down and current flows to the node N12. As a result, the oscillation waveform is clipped. This is the degradation of the phase noise performance due to the diode clipping.

On the other hand, because the nodes N21 and N22 have the same voltage as the oscillation common voltage at the time of capacitance-off in the circuit 100, it is possible to avoid the phase noise degradation due to diode clipping.

(2) Second Embodiment

Figure 6:
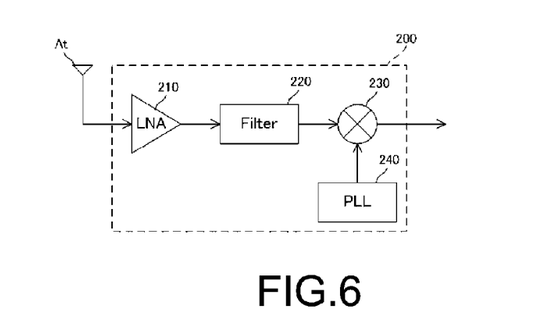
FIG. 6 is a diagram showing the general configuration of an RF receiver.
Figure 7:
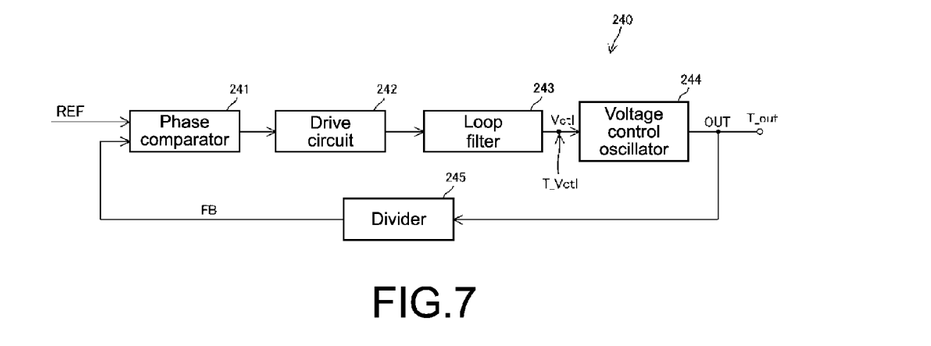
FIG. 7 is a diagram showing the general configuration of a PLL (frequency synthesizer)

FIG. 6 is a diagram showing the general configuration of an RF receiver, and FIG. 7 is a diagram showing the general configuration of a PLL (frequency synthesizer) shown in FIG. 6. Examples of such an RF receiver include a general apparatus using a PLL, such as a television, a tuner, a GPS, and a communication apparatus.
(Configuration of RF Receiver)

An RF receiver 200 shown in FIG. 6 includes an antenna At, a low-noise amplifier 210, a filter 220, a mixer 230, and a PLL 240 serving as a frequency synthesizer.

The PLL 240 shown in FIG. 7 includes a phase comparator 241, a drive circuit 242 using a charge pump, a loop filter 243, a voltage control oscillator 244, and a divider 245. For the voltage control oscillator 244 of the RF receiver 200 configured as described above, an LC-VCO is generally used.
(LC-VCO)

Figure 8:
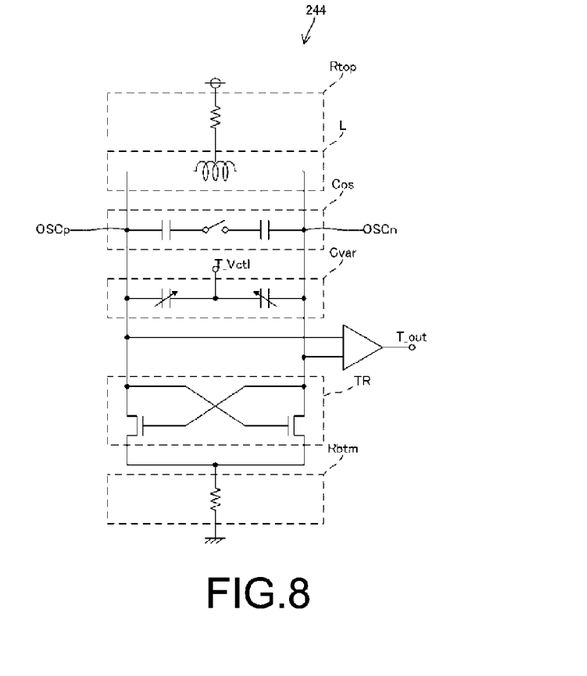
FIG. 8 is a diagram showing the general configuration of an LC-VCO.

FIG. 8 is a diagram showing the general configuration of an LC-VCO.

As shown in FIG. 8, the LC-VCO includes an inductor L, an offset capacitance Cos, a varactor capacitance Cvar, a transistor TR that functions as a negative resistance cancelling out the parasitic resistance component of the LC part, bias resistances Rtop and Rbtm of a circuit, and an output amplifier. A terminal T_Vctl shown in FIG. 8 corresponds to a terminal T_Vctl shown in FIG. 7, and an output voltage terminal T_out corresponds to a terminal T_out shown in FIG. 7. By using the differential capacitive circuit according to the first embodiment for the offset capacitance Cos, it is possible to improve the phase noise performance in the LC-VCO and to improve the simulation time or simulation accuracy at the design stage.

Now, the operation of a PLL using an LC-VCO for the voltage control oscillator 244 will be described simply.

First, the phase comparator 241 detects the phase difference between a reference signal REF and a signal FB that has divided an output OUT of the PLL 240 as phase difference information, and the detected phase difference information is transmitted to the drive circuit 242. The drive circuit 242 causes current depending on the phase difference information to flow to the loop filter 243, and the loop filter 243 converts the current into voltage Vctl. The voltage control oscillator 244 receives the voltage Vctl, changes the capacitance of the varactor capacitance Cvar, and changes the oscillation frequency.

The feedback is repeated until the phase (frequency) of the reference signal REF is the same as that of the signal FB, and thus, a clock that is synchronized with the reference signal REF is generated.
(Vctl to Frequency Characteristics)

Figure 9:
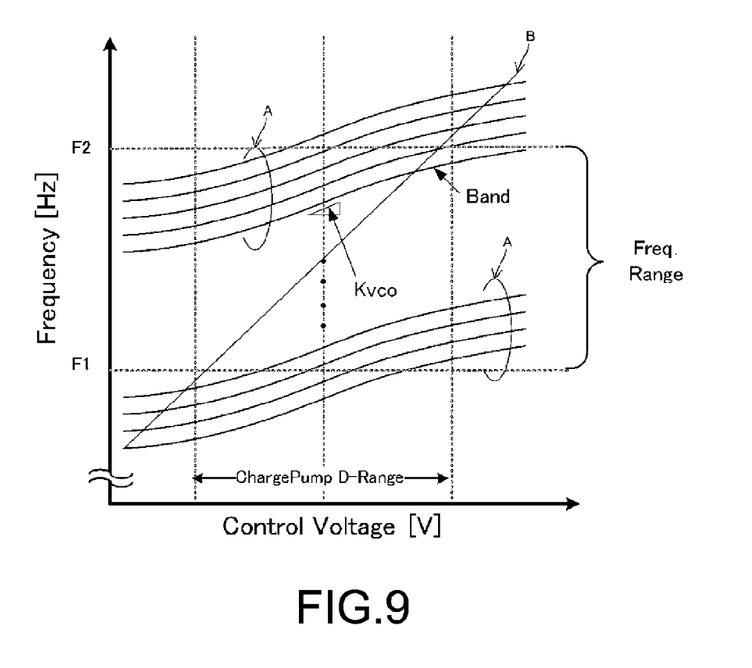
FIG. 9 is a diagram showing the control voltage to frequency characteristics of the LC-VCO.

FIG. 9 is a diagram showing the control voltage to frequency characteristics of the LC-VCO.

The oscillation frequency of the LC-VCO can be generally changed in the range of about two times at most in view of the practical performance, and the frequency is changed as shown by symbols A in FIG. 9. This is achieved by providing several bits of the varactor capacitance Cvar and the offset capacitance Cos, changing the capacitance gradually (digitally), and changing the capacitance continuously (analogically) between the gradually changed capacitance values with the varactor capacitance Cvar.

For example, the frequency characters shown by a symbol B in FIG. 9 are possible. However, it is very difficult to achieve such frequency characters by the LC-VCO, and a voltage to frequency conversion gain Kvco of the voltage control oscillator 244 is large even if the frequency characters can be achieved. When the voltage to frequency conversion gain Kvco is large, the current noise of the drive circuit 242, the resistance noise of the loop filter 243, or the like is multiplied by Kvco, and is converted into the output phase noise of the voltage control oscillator 244.

Therefore, generally, the voltage to frequency conversion gain Kvco is favorably small. By reducing the voltage to frequency conversion gain Kvco as possible, it is possible to relax the PLL phase noise design. Specifically, the oscillation frequency is generally changed as shown by the characteristics curve A in FIG. 9, and a moderately broad frequency range can be covered with a low gain Kvco.

One frequency covering range digitally switched will be referred to as "band." Here, it is very important to make a frequency redundancy in each band, and the frequency redundancy will be referred to as "band overlap."

(3) Third Embodiment

Next, a calibration system in which the oscillation frequency of a voltage control oscillator is calibrated will be described.
(Configuration of Calibration System)

Figure 10:
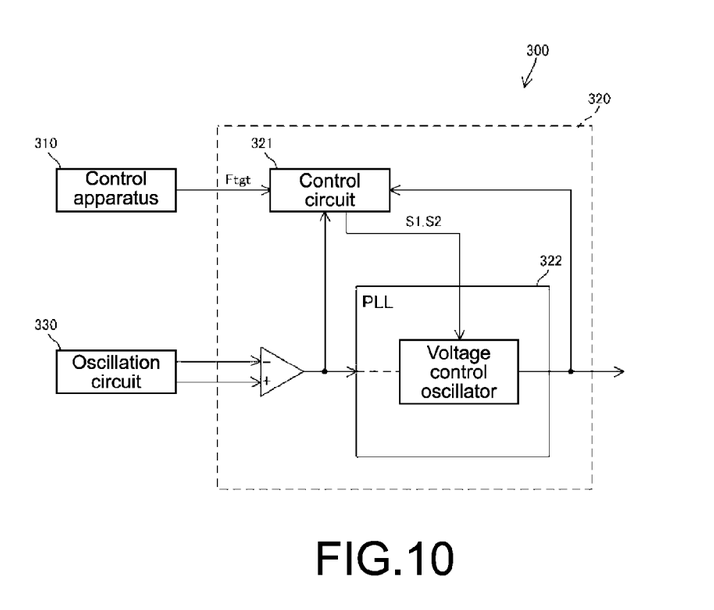
FIG. 10 is a diagram showing a calibration system.

FIG. 10 is a diagram showing a calibration system. A calibration system 300 shown in FIG. 10 includes a communication apparatus 320 that includes a PLL 322 and a control circuit 321, and a control apparatus 310 configured to control the calibration performed by the control circuit 321 from the outside of the communication apparatus 320. It should be noted that to the PLL 322 and the control circuit 321, a clock signal is supplied from an oscillation circuit 330 such as a crystal oscillator.

The control circuit 321 includes a frequency counter, a target frequency-storing circuit, and a counter value-holding circuit that holds a counter value C obtained from the frequency counter. The control circuit 321 is configured to be capable of communicating with the external control apparatus 310, and store, in the target frequency-storing circuit, information according to a target frequency Ftgt input from the control apparatus 310.

The control circuit 321 includes a comparison circuit configured to compare the target frequency Ftgt with the counter value C counted by the frequency counter.

The control circuit 321 is configured to determine the comparison results obtained from the comparison circuit, and includes a control circuit that supplies a control signal Con to a voltage control oscillator in the PLL 322, and a bias circuit that gives control voltage Vctl to a control voltage terminal of the voltage control oscillator.

(VCO)

Figure 11:
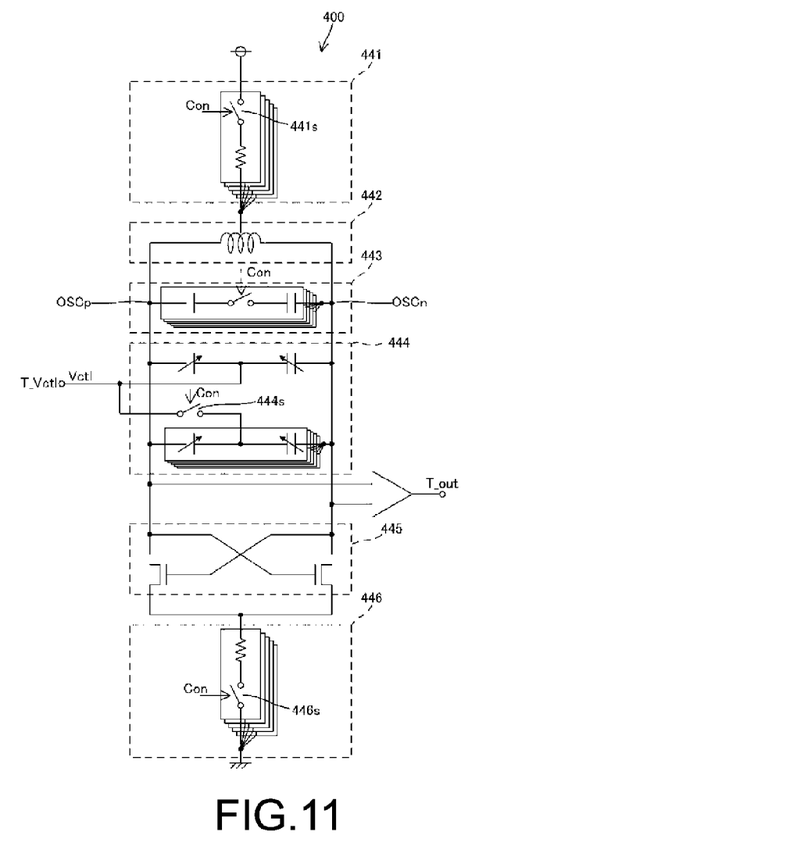
FIG. 11 is a diagram showing the configuration of a voltage control oscillator being a calibration target.

FIG. 11 is a diagram showing the configuration of a voltage control oscillator being a calibration target.

A voltage control oscillator 400 shown in FIG. 11 includes an inductor 442, an offset capacitance bank 443, a varactor capacitance bank 444, a transistor 445 for achieving a negative resistance, and bias resistance banks 441 and 446 of a circuit. A terminal T_Vctl shown in FIG. 11 corresponds to the terminal T_Vctl shown in FIG. 7, and an output voltage terminal T_out corresponds to the terminal T_out shown in FIG. 7.

The inductor 442 and the transistor 445 are the same as the inductor L shown in FIG. 7.

The offset capacitance bank 443 is obtained by arranging a plurality of offset capacitances Cos shown in FIG. 7 in parallel. Each offset capacitance Cos includes the circuit 100 according to the first embodiment, and "capacitance-on" and "capacitance-off" are switched by the control signal Con that is the same as the control signal S1.

The varactor capacitance bank 444 is obtained by arranging a plurality of varactor capacitances Cvar shown in FIG. 7 in parallel. A control voltage Vctl is constantly input to a connection node of two variable capacitances, which are connected to each other in series, of one of the plurality of varactor capacitances Cvar, and a control voltage Vctl is input to the other connection node of the two variable capacitances, which are connected to each other in series, of the varactor capacitances Cvar via a switch circuit 444s. The switch circuit 444s is controlled to be turned on when the control signal Con is input, and to be turned off when the control signal Con is not input.

The bias resistance bank 441 is obtained by arranging a plurality of configurations, each of which includes a bias resistance Rtop and a switch circuit 441s connected in series, at the position of the bias resistance Rtop shown in FIG. 8 in parallel. The switch circuit 441s is controlled to be turned on when the control signal Con is input, and to be turned off when the control signal Con is not input.

The bias resistance bank 446 is obtained by arranging a plurality of configurations, each of which includes a bias resistance Rbtm and a switch circuit 446s connected in series, at the position of the bias resistance Rbtm shown in FIG. 8 in parallel. The switch circuit 446s is controlled to be turned on when the control signal Con is input, and to be turned off when the control signal Con is not input.

In the voltage control oscillator 400 described above, if the capacitance value of the offset capacitance bank 443 is increased, control is performed so that the capacitance value of the varactor capacitance bank 444 is increased and the resistance values of the bias resistance banks 441 and 446 are decreased.

Specifically, of offset capacitances constituting the offset capacitance bank 443, an offset capacitance that is controlled to be in the state of capacitance-on functions as the offset capacitance of the voltage control oscillator 400.

Similarly, of varactor capacitance banks constituting the varactor capacitance bank 444, which are not in an always-on connection state, a varactor capacitance to which the control voltage Vctl is input when the switch circuit 444s is controlled to be turned on functions as the varactor capacitance of the voltage control oscillator 400.

Similarly, when the switch circuit 441s or 446s is controlled to be turned on, the bias resistance constituting the bias resistance bank 441 or 446 functions as the bias resistance of the voltage control oscillator.

(Calibration Sequence)

Figure 13:
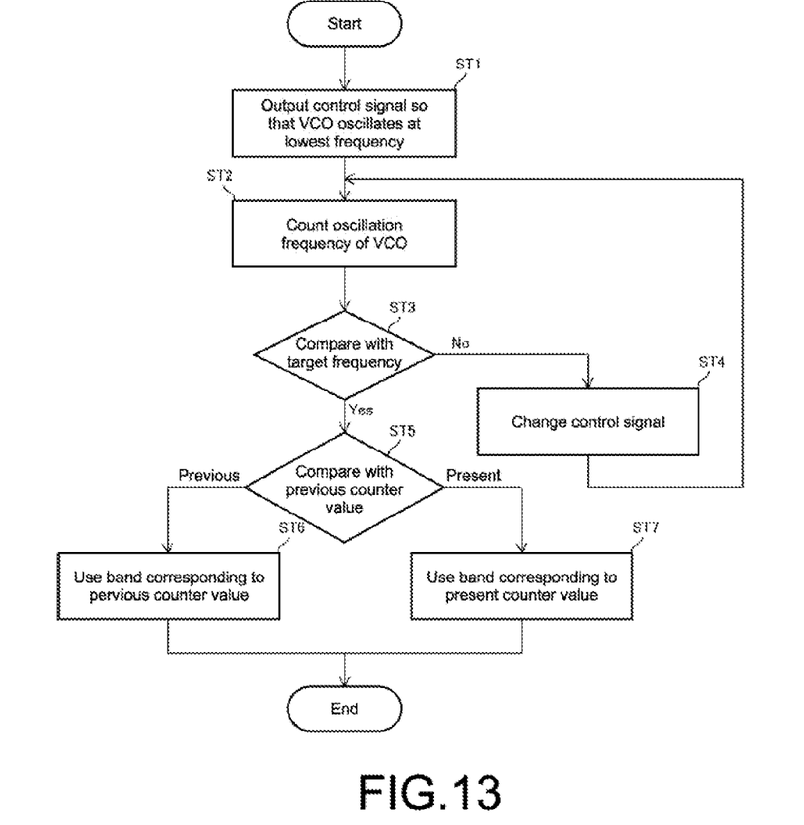
FIG. 13 is a diagram showing a calibration sequence.

FIG. 13 is a diagram showing a calibration sequence.

Figure 12:
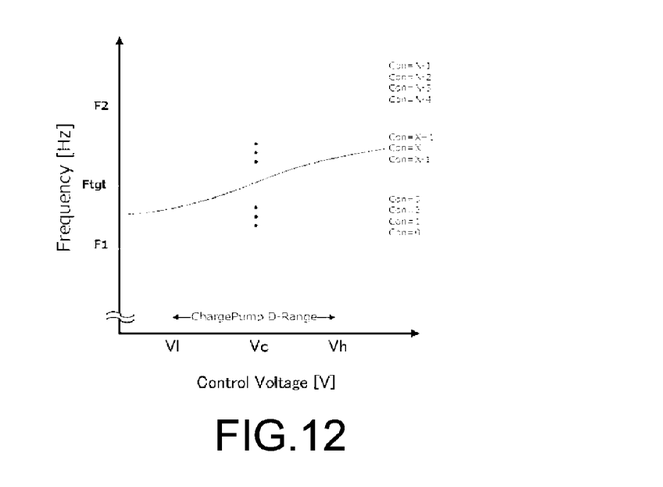
FIG. 12 is a diagram showing the transition of the frequency characteristics in the LC-VCO.

The control circuit 321 shown in FIG. 10 is configured to output the control signal Con (Con=0 shown in FIG. 12) so that the voltage control oscillator 400 oscillates at the lowest frequency, and gives an appropriate control voltage value (Vctl), e.g., Vc shown in FIG. 12, at the bias circuit (ST1). At this time, all of the offset capacitances constituting the offset capacitance bank 443 formed in a capacitance bank form are controlled to be in the state of capacitance-on. Specifically, because the capacitance value of the offset capacitance bank 443 is maximized, control is performed so that the capacitance value of the varactor capacitance bank 444 is maximized and the resistance values of the bias resistance banks 441 and 446 are minimized.

Next, in the state, the frequency counter uses an external reference clock Clk to count the oscillation frequency of the voltage control oscillator 400 (ST2). The comparison circuit compares the counter value C being the counting results obtained from the frequency counter with the target frequency Ftgt stored in the target frequency storing circuit (ST3).

In the case where the counter value C obtained from the frequency counter is lower than the target frequency Ftgt (ST3: No), the counter C is held in the counter value holding circuit, the control circuit 321 changes the control signal Con so that the oscillation frequency of the voltage control oscillator 400 is increased (ST4), and the processes of Step ST2 and Step ST3 are performed again.

Specifically, the calibration is started with Con=0 shown in FIG. 12, and the control signal Con comes closer to X corresponding to the target frequency Ftgt by gradually changing the control signal Con.

In the case where the counter value C obtained from the frequency counter exceeds the target frequency Ftgt (ST3: Yes), the present counter value C is compared with the previous counter C held in the counter value holding unit to determine which counter value is closer to the target frequency Ftgt (ST5).

In the case where the previous counter value C is closer to the target frequency Ftgt (ST5: previous), the band corresponding to the previous counter value C is used (ST6) to finish the process. In the case where the present counter value C is closer to the target frequency Ftgt (ST5: present), the band corresponding to the present counter value C is used (ST7) to finish the process.

It should be noted that embodiments of the present disclosure are not limited to the above-mentioned embodiments, and include a configuration obtained by replacing the configurations disclosed in the above-mentioned embodiments with each other or changing the combination thereof, a configuration obtained by replacing the configurations disclosed in well-known techniques and the above-mentioned embodiments with each other or changing the combination thereof, and the like. Moreover, the technical range of the embodiments of the present disclosure is not limited to the above-mentioned embodiments, and includes matters described in claims and equivalents thereof.

The present disclosure may also take the following configurations.

(a) A circuit, including:
a first capacitance arranged on a first path that connects a first terminal and a second terminal;
a second capacitance arranged on the first path between the first capacitance and the second terminal;
a first switch arranged on the first path between the first capacitance and the second capacitance;
a second switch arranged on a second path that connects a first node and a reference voltage section, the first node being formed on the first path between the first capacitance and the first switch;
a third switch arranged on a third path that connects a second node and the reference voltage section, the second node being formed on the first path between the second capacitance and the first switch;
a first resistance arranged on a fourth path that connects a third node and the first node, the third node being formed on the first path between the first terminal and the first capacitance;
a second resistance arranged on a fifth path that connects a fourth node and the second node, the fourth node being formed on the first path between the second terminal and the second capacitance;
a fourth switch arranged on the fourth path; and
a fifth switch arranged on the fifth path.

(b) The circuit according to (1) above, in which
the first switch, the second switch, and the third switch are turned on and off in synchronization with each other,
the fourth switch and the fifth switch are turned on and off in synchronization with each other, and
the first switch, the second switch, and the third switch are turned on and off complementarily to the fourth switch and the fifth switch.

(c) A voltage control oscillator, including
an LC resonance circuit that is configured to oscillate at a resonance frequency depending on control voltage and includes a capacitive circuit, the capacitive circuit including
a first capacitance arranged on a first path that connects a first terminal and a second terminal,
a second capacitance arranged on the first path between the first capacitance and the second terminal,
a first switch arranged on the first path between the first capacitance and the second capacitance,
a second switch arranged on a second path that connects a first node and a reference voltage section, the first node being formed on the first path between the first capacitance and the first switch,
a third switch arranged on a third path that connects a second node and the reference voltage section, the second node being formed on the first path between the second capacitance and the first switch,
a first resistance arranged on a fourth path that connects a third node and the first node, the third node being formed on the first path between the first terminal and the first capacitance,
a second resistance arranged on a fifth path that connects a fourth node and the second node, the fourth node being formed on the first path between the second terminal and the second capacitance,
a fourth switch arranged on the fourth path, and
a fifth switch arranged on the fifth path.

(d) An oscillation frequency control system, including:
a communication apparatus including
a voltage control oscillator that includes an LC resonance circuit configured to oscillate at a resonance frequency, and
a control circuit configured to control the resonance frequency of the voltage control oscillator; and
a control apparatus configured to instruct the control circuit on a resonance frequency, the LC resonance circuit including a capacitive bank circuit in which a plurality of capacitive circuits and a plurality of switch circuits are connected in series and arranged between the first terminal and the second terminal in parallel, each of the plurality of capacitive circuits including
a first capacitance arranged on a first path that connects a first terminal and a second terminal,
a second capacitance arranged on the first path between the first capacitance and the second terminal,
a first switch arranged on the first path between the first capacitance and the second capacitance,
a second switch arranged on a second path that connects a first node and a reference voltage section, the first node being formed on the first path between the first capacitance and the first switch,
a third switch arranged on a third path that connects a second node and the reference voltage section, the second node being formed on the first path between the second capacitance and the first switch,
a first resistance arranged on a fourth path that connects a third node and the first node, the third node being formed on the first path between the first terminal and the first capacitance,
a second resistance arranged on a fifth path that connects a fourth node and the second node, the fourth node being formed on the first path between the second terminal and the second capacitance,
a fourth switch arranged on the fourth path, and
a fifth switch arranged on the fifth path, the control circuit being configured to switch the switch circuit depending on the resonance frequency instructed by the control apparatus.

It should be understood by those skilled in the art that various modifications, combinations, sub-combinations and alterations may occur depending on design requirements and other factors insofar as they are within the scope of the appended claims or the equivalents thereof.

What is claimed is:
1. A circuit, comprising:
a first capacitance arranged on a first path that connects a first terminal and a second terminal;
a second capacitance arranged on the first path between the first capacitance and the second terminal;
a first switch arranged on the first path between the first capacitance and the second capacitance;

a second switch arranged on a second path that connects a first node and a reference voltage section, the first node being formed on the first path between the first capacitance and the first switch;

a third switch arranged on a third path that connects a second node and the reference voltage section, the second node being formed on the first path between the second capacitance and the first switch;

a first resistance arranged on a fourth path that connects a third node and the first node, the third node being formed on the first path between the first terminal and the first capacitance;

a second resistance arranged on a fifth path that connects a fourth node and the second node, the fourth node being formed on the first path between the second terminal and the second capacitance;

a fourth switch arranged on the fourth path; and a fifth switch arranged on the fifth path.

2. The circuit according to claim 1, wherein the first switch, the second switch, and the third switch are turned on and off in synchronization with each other, the fourth switch and the fifth switch are turned on and off in synchronization with each other, and the first switch, the second switch, and the third switch are turned on and off complementarily to the fourth switch and the fifth switch.

3. A voltage control oscillator, comprising an LC resonance circuit that is configured to oscillate at a resonance frequency depending on control voltage and includes a capacitive circuit, the capacitive circuit including a first capacitance arranged on a first path that connects a first terminal and a second terminal, a second capacitance arranged on the first path between the first capacitance and the second terminal, a first switch arranged on the first path between the first capacitance and the second capacitance, a second switch arranged on a second path that connects a first node and a reference voltage section, the first node being formed on the first path between the first capacitance and the first switch, a third switch arranged on a third path that connects a second node and the reference voltage section, the second node being formed on the first path between the second capacitance and the first switch, a first resistance arranged on a fourth path that connects a third node and the first node, the third node being formed on the first path between the first terminal and the first capacitance, a second resistance arranged on a fifth path that connects a fourth node and the second node, the fourth node being formed on the first path between the second terminal and the second capacitance, a fourth switch arranged on the fourth path, and a fifth switch arranged on the fifth path.

4. An oscillation frequency control system, comprising:

a communication apparatus including a voltage control oscillator that includes an LC resonance circuit configured to oscillate at a resonance frequency, and a control circuit configured to control the resonance frequency of the voltage control oscillator; and a control apparatus configured to instruct the control circuit on a resonance frequency, the LC resonance circuit including a capacitive bank circuit in which a plurality of capacitive circuits and a plurality of switch circuits are connected in series and arranged between the first terminal and the second terminal in parallel, each of the plurality of capacitive circuits including a first capacitance arranged on a first path that connects a first terminal and a second terminal, a second capacitance arranged on the first path between the first capacitance and the second terminal, a first switch arranged on the first path between the first capacitance and the second capacitance, a second switch arranged on a second path that connects a first node and a reference voltage section, the first node being formed on the first path between the first capacitance and the first switch, a third switch arranged on a third path that connects a second node and the reference voltage section, the second node being formed on the first path between the second capacitance and the first switch, a first resistance arranged on a fourth path that connects a third node and the first node, the third node being formed on the first path between the first terminal and the first capacitance, a second resistance arranged on a fifth path that connects a fourth node and the second node, the fourth node being formed on the first path between the second terminal and the second capacitance, a fourth switch arranged on the fourth path, and a fifth switch arranged on the fifth path, the control circuit being configured to switch the switch circuit depending on the resonance frequency instructed by the control apparatus.

* * * * *